(12) United States Patent
Jin et al.

(10) Patent No.: US 11,411,424 B2
(45) Date of Patent: Aug. 9, 2022

(54) REPEATABLE FAST TURN-ON OF TRANSISTORS

(71) Applicant: TEXAS INSTRUMENTS INCORPORATED, Dallas, TX (US)

(72) Inventors: Huawen Jin, Dallas, TX (US); Kenneth J. Maggio, Irving, TX (US); Thomas James Jung, Jr., Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 292 days.

(21) Appl. No.: 16/858,335

(22) Filed: Apr. 24, 2020

(65) Prior Publication Data
US 2020/0403434 A1 Dec. 24, 2020

Related U.S. Application Data

(60) Provisional application No. 62/864,832, filed on Jun. 21, 2019, provisional application No. 62/865,041, filed on Jun. 21, 2019.

(51) Int. Cl.
| | |
|---|---|
| *H02J 7/00* | (2006.01) |
| *H02J 7/34* | (2006.01) |
| *H02M 3/07* | (2006.01) |
| *H03K 17/0412* | (2006.01) |
| *H03K 17/041* | (2006.01) |
| *H02M 1/00* | (2006.01) |

(52) U.S. Cl.
CPC ........ *H02J 7/007182* (2020.01); *H02J 7/345* (2013.01); *H02M 1/0006* (2021.05); *H02M 3/07* (2013.01); *H03K 17/0412* (2013.01); *H03K 17/04106* (2013.01); *H03K 17/04123* (2013.01); *H02J 2207/20* (2020.01)

(58) Field of Classification Search
CPC .. H02J 7/007182; H02J 7/345; H02J 2207/20; H02M 1/0006; H02M 3/07; H03K 17/04106; H03K 17/0412; H03K 17/04123
USPC .......................... 320/137, 140; 327/536, 537
See application file for complete search history.

(56) References Cited

U.S. PATENT DOCUMENTS

| | | | | |
|---|---|---|---|---|
| 5,258,662 A | * | 11/1993 | Skovmand | ........... H03K 17/063 327/365 |
| 10,666,245 B2 | * | 5/2020 | Sanchez | ............... H03K 17/063 |
| 2007/0085573 A1 | * | 4/2007 | Henzler | ............... H03K 17/163 327/143 |

(Continued)

*Primary Examiner* — Richard Isla
*Assistant Examiner* — Manuel Hernandez
(74) *Attorney, Agent, or Firm* — Ray A. King; Charles A. Brill; Frank D. Cimino

(57) ABSTRACT

This disclosure relates to a system that includes a boost circuit comprising a boost capacitor. The boost circuit is configured to provide a boost voltage at a first terminal of the boost capacitor by increasing the boost voltage at the first terminal to exceed a target voltage for a given charge cycle. A boost switch is configured to supply the boost voltage from the first terminal to a charge node for turning on a transistor, which is coupled to the charge node, based on a boost signal during the given charge cycle. A pull-down circuit is configured to control discharge of the charge node to a clamp voltage that is sufficient to turn off the transistor for the given charge cycle and to facilitate charging of the charge node in a next charge cycle.

21 Claims, 12 Drawing Sheets

(56) References Cited

U.S. PATENT DOCUMENTS

2014/0111246 A1* 4/2014 Callanan .......... H03K 17/04126
                                                    326/18
2017/0317583 A1* 11/2017 Forghani-Zadeh ...... H03K 5/08
2020/0280307 A1* 9/2020 Hunter ................. H03K 17/166

* cited by examiner

REPEATABLE FAST TURN-ON OF TRANSISTORS

CROSS-REFERENCE TO RELATED APPLICATIONS

This application claims the benefit of priority from U.S. provisional patent application No. 62/864,832, filed Jun. 21, 2019, and U.S. provisional patent application No. 62/865,041, filed Jun. 21, 2019, each of which is incorporated herein by reference in its entirety.

TECHNICAL FIELD

This disclosure relates generally to a repeatable approach to implement fast turn-on of a transistor, such as for charging a battery.

BACKGROUND

Battery packs typically integrate a pair of inline transistors to control charging and discharging currents. For example, a high-side inline transistor requires a charge pump to create a positive gate voltage above the battery voltage. However, the charge pump has a relatively slow reaction that tends to be incapable to turn on and off repeatedly at a relatively fast rate, such as under heavy load conditions.

SUMMARY

One example includes a system that includes a boost circuit comprising a boost capacitor. The boost circuit is configured to provide a boost voltage at a first terminal of the boost capacitor by increasing the boost voltage at the first terminal to exceed a target voltage for a given charge cycle. A boost switch is configured to supply the boost voltage from the first terminal to a charge node for turning on a transistor, which is coupled to the charge node, based on a boost signal during the given charge cycle. A pull-down circuit is configured to control discharge of the charge node to a clamp voltage that is sufficient to turn off the transistor for the given charge cycle and to facilitate charging of the charge node in a next charge cycle.

Another example provides a circuit that includes a charge pump having an output coupled to a charge terminal. The charge terminal is adapted to be coupled to a control input of a charge transistor. A pull-down circuit is coupled between the charge terminal and a first voltage terminal having a voltage lower than a voltage of the charge terminal. A refresh device has an input coupled to a second voltage terminal and has an output coupled to a first boost terminal. A third voltage terminal has an output coupled to a second boost terminal. A boost capacitor is coupled between the first and second boost terminals. A boost switch is coupled between the output of the charge pump and a node between the output of the refresh device and the first boost terminal.

As yet another example, a method includes charging a boost capacitor to provide a boost voltage at a first terminal of the boost capacitor that exceeds a target voltage. The method also includes supplying the boost voltage from the first terminal of the boost capacitor to a charge node for turning on a charge transistor based on a boost signal, the charge transistor being coupled to the charge node. The method also includes controlling discharge of the charge node to a clamp voltage that is sufficient to turn off the charge transistor and facilitate charging of the charge node.

DETAILED DESCRIPTION

Figure 1:
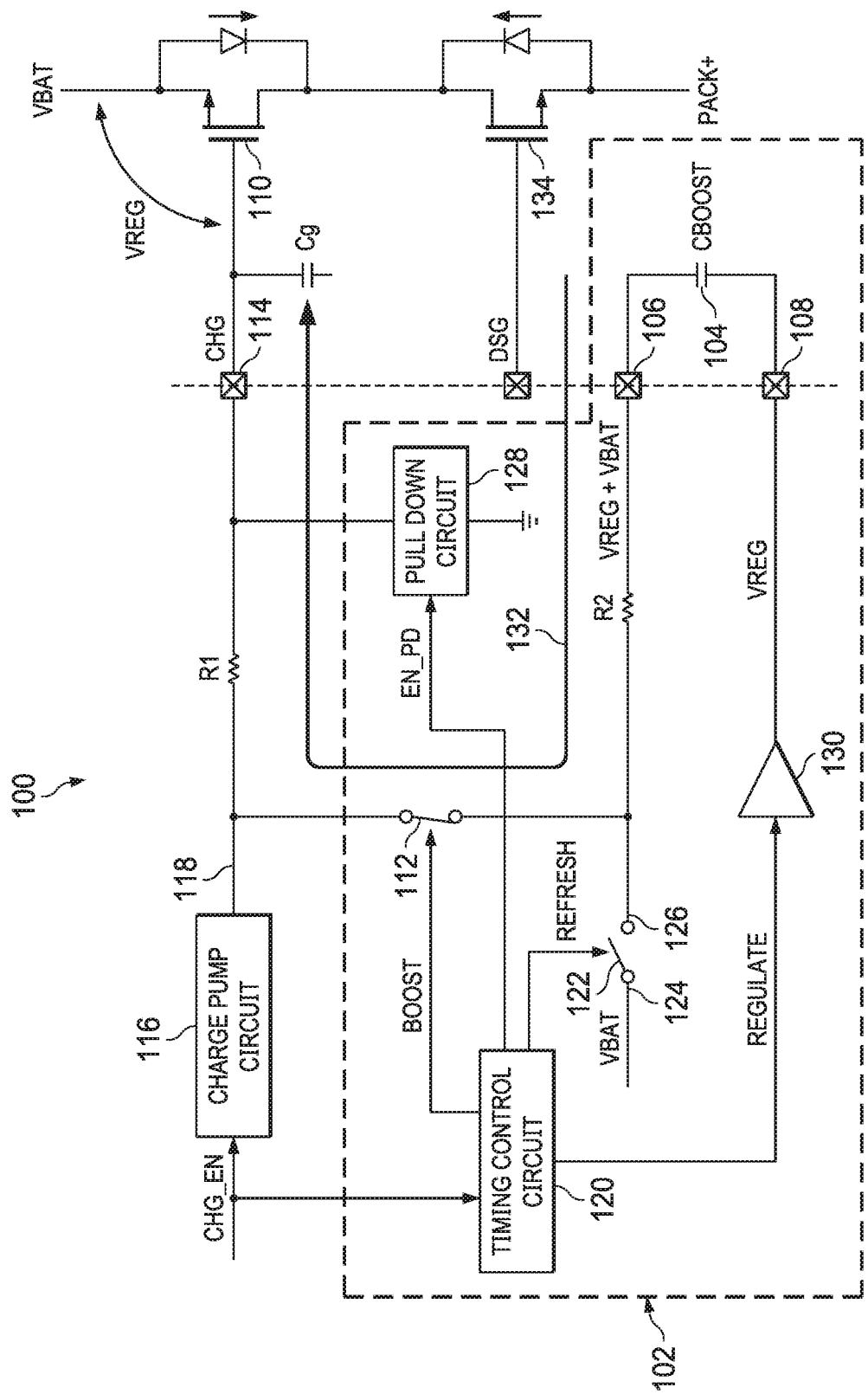
FIG. 1 depicts an example of a system and circuitry to implement repetitive boosting conditions for turning on a transistor.

This disclosure relates to methods, systems, and circuitry to implement fast turn on of a transistor, such as for use in charging a battery. For example, a charge pump can be coupled to a charge terminal and configured to provide a charge pump voltage for turning on and off a charge transistor, such as a field effect transistor (FET). The FET can be turn on by the charge pump voltage to charge a battery based on a voltage stored in in a battery pack. The frequency of charging can vary depending on the load that is being powered by the battery. Existing charge pump circuits often have a slow reaction time especially when a repeated high-speed turn on sequence is required at the charge terminal to activate the charge transistor to perform desired charging operations. Accordingly, a boost circuit is utilized to compensate for the slow reaction time of the charge pump circuit.

The boost circuit includes a boost capacitor that is pre-charged in advance of each charge sequence to provide a corresponding boosted voltage that can be added to the charge pump voltage at the charge terminal to facilitate fast turn on of the charge transistor over a number of charge sequences. A pull-down circuit may be coupled to the charge terminal and configured to discharge the charge terminal to a clamp voltage for turning off the transistor. The clamp voltage can be set to a level that is sufficient to turn off the charge transistor after charging has been completed, yet still maintain a sufficient voltage level to facilitate charging of the charge terminal in the next charge cycle. This partial discharge of the charge terminal between cycles is referred to herein as 'soft pulldown.' As a result of implementing the soft pull down (in place of a hard pull down to electrical ground), the boost capacitor also maintains additional charge over a plurality of charge cycles and thereby reduce voltage droop that tends to occur in existing approaches. To recharge the boost capacitor to a target voltage (e.g., the battery voltage), a refresh circuit can be activated to couple the target voltage to a terminal of the boost capacitor. Additionally, to enable boosting above the target voltage, a regulator can be activated to supply a regulated voltage to another terminal of the boost capacitor. By adding the regulated voltage to the target voltage to charge the boost capacitor, the boost voltage of the boost capacitor can be refreshed at a sufficient rate to enable fast turn on of the transistor repeatedly over numerous charge sequences. As disclosed herein, various parameters associated with controlling the boosting operation may be programmable, such as to set a duration for the refresh and pull-down operations.

As used herein, the term "circuit" can include a collection of active and/or passive elements that perform a circuit function, such as an analog circuit and/or digital circuit. Additionally or alternatively, for example, the term "circuit" can include an integrated circuit (IC) where all or some of the circuit elements are fabricated on a common substrate (e.g., semiconductor substrate, such as a die or chip) or within a common package herein. For example, circuitry of a power converter (e.g., the control loops, switch circuits, drivers and the like) may be implemented in an IC chip.

Additionally, the term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

FIG. 1 depicts an example of a system 100 configured to turn on (e.g., activate) a transistor 110 for charging an energy storage element, such as a battery. In some examples, the system 100 includes circuitry that is implemented as part of a mobile computing device, such as a smart phone, a laptop or a tablet computer or any other device powered by a rechargeable battery that includes one or more battery cells. The system 100 includes a boost circuit 102 configured to provide a boost voltage at the terminal 106 to facilitate turning on the transistor 110 that is coupled to a charge (CHG) terminal (also referred to as a node) 114. A control input of the transistor 110 is coupled to the charge node. In the example of FIG. 1, the transistor 110 is demonstrated as being N-channel metal oxide semiconductor (NMOS) field effect transistor that has a gate coupled to the CHG node 114. The NMOS transistor 110 also has a source, which is adapted to be coupled to a battery (e.g., a positive battery terminal having a battery voltage, demonstrated as VBAT). In other examples, the transistor 110 may be implemented by other types of transistors, such as Group III-V transistor (e.g., a gallium nitride (GaN) transistor), an isolated gate bipolar transistor (IGBT), a bipolar junction transistor (BJT) and silicon carbide (SiC) transistor.

In the example of FIG. 1, a capacitance is provided at the CHG node 114, demonstrated at CG. The capacitance CG can be due to the gate capacitance of the transistor 110 (e.g., an NMOS device), due to an external capacitor coupled to the CHG node 114, or a combination of an external capacitor coupled to the CHG node 114 and gate capacitance of the transistor 110. For example, an NMOS device has a turn-on delay that is impacted by the capacitance CG at the CHG node 114. More particularly, the turn-on delay for each MOSFET is based in part on the time taken to charge the gate capacitance of the MOSFET before drain current conduction can start.

The system 100 also includes a charge pump 116 having an output 118 coupled to the CHG node 114 through a resistor R1. The charge pump 116 is configured (e.g., as a DC-to-DC converter) to provide a charge pump voltage at the output 118 for turning on the transistor 110. For example, the charge pump 116 is activated to provide the charge pump voltage in response to charge enable (CHG_EN) signal. As mentioned, however, the charge pump 118 exhibits a slow reaction time especially when a repeated high-speed turn on sequence is required to activate the charge transistor. Accordingly, as disclosed herein, the boost circuit 102 is configured to supply a boost voltage to the CHG node 114 to enable fast turn on of the transistor 110 repeatedly over a number of charge cycles. In this way, the boost circuit 102 bootstraps the operation of the charge pump 118 to enable fast turn on of the transistor 110 repeatedly over a number of charge cycles to facilitate charging a battery coupled at the VBAT node.

In the example of FIG. 1, the boost circuit 102 includes a timing control circuit 120 configured to control sequencing and duration of various signals for controlling the boost circuit 102 based on the CHG_EN signal. The boost circuit 102 also includes a boost capacitor 104 having a capacitance, indicated at CBOOST, coupled between terminals 106 and 108. The terminal 106 is coupled to output of the charge pump 118 through a resistor R2 and boost switch 112. The boost switch 112 is activated to an ON condition based on a BOOST signal to provide the boost voltage to the CHG node 114. The boost circuit 102 is configured to supply the boost voltage to exceed a target voltage by at least a threshold voltage. In examples disclosed herein, the target voltage corresponds to the battery voltage (VBAT), such as stored in one or more cells of a battery that is coupled to the source of transistor 110. In other examples, the target voltage may correspond to a different voltage in the system 100, which may vary depending on the use environment of the system. The threshold voltage is a minimum voltage above the target voltage (e.g., VBAT) that is needed at the CHG node 114 to turn on the transistor 110.

The boost circuit 102 also includes a refresh device 122 having an input 124 coupled to a voltage terminal, such as that provides the target voltage (e.g., VBAT). An output 126 of the refresh device of the refresh device 122 is coupled to the terminal 106, such as through a resistor R2. In the example of FIG. 1, the refresh device 122 is a switch coupled between VBAT and the terminal 106. The boost switch 112 is coupled between the output 118 of the charge pump 116 and the node corresponding to the terminal 126. The boost circuit 102 further includes a voltage regulator 130 having an output coupled to the terminal 108. The voltage regulator 130 is configured to provide a regulated voltage (VREG) at the terminal 108 to the boost capacitor 104 based on a REGULATE signal provided by the timing control circuit 120. For example, the voltage regulator 130 provides VREG to be at least equal to the threshold voltage. The timing control circuit 120 is also configured to provide a REFRESH signal to control the refresh device 122 and the BOOST signal to the boost switch 112.

As disclosed herein, in response to a charge cycle being enabled by the CHG_EN signal, the timing control circuit 120 provides the REFRESH signal to charge the boost capacitor 104 according to the voltage at the switch terminal 124 corresponding to VBAT. The timing control circuit 120 also provides a REGULATE signal to activate the voltage regulator 130 to provide the regulated output voltage VREG to the other terminal 108 of the boost capacitor 104. This results in increasing the voltage across the boost capacitor 104 by VREG thereby providing an aggregated voltage (e.g., VREG+VBAT) at the terminal 106. Thus, in response to the timing control circuit 120 closing the boost switch 112, such as shown in the example of FIG. 1, the increased aggregate voltage (e.g., VREG+VBAT) is provided along a path, demonstrated at 132, from the terminal 106 to the CHG node 114. The circuit 100 also includes a pull down circuit 128 coupled between the CHG node 114 and a terminal (e.g., electrical ground terminal) having a voltage that is less than the voltage at the node 114.

In the example of FIG. 1, the transistor 110 is connected with another transistor 134 provided as a pair of inline transistors 110 and 134 between the battery node having the battery voltage VBAT and a PACK+ node. The inline transistors 110 and 134 thus provide back-to-back diodes to isolate the VBAT node and the PACK+ node. In an example, measurement circuitry (not shown) could be coupled at the node connected between transistors 110 and 134. The inline transistors 110 and 134 also enable current flow between the nodes at VBAT and PACK+ for charging and discharging the battery coupled at the VBAT node. For example, when the transistor 110 is turned on, as disclosed herein, current flows from a power source coupled at the PACK+ node (e.g., an external battery charger circuit) through the diode of transistor 134 to charge the battery coupled at VBAT. Similarly, when the transistor 134 is turned on, the battery can be discharged by current flowing from the VBAT node through the diode of transistor 110 and to the PACK+ node.

Figure 2:
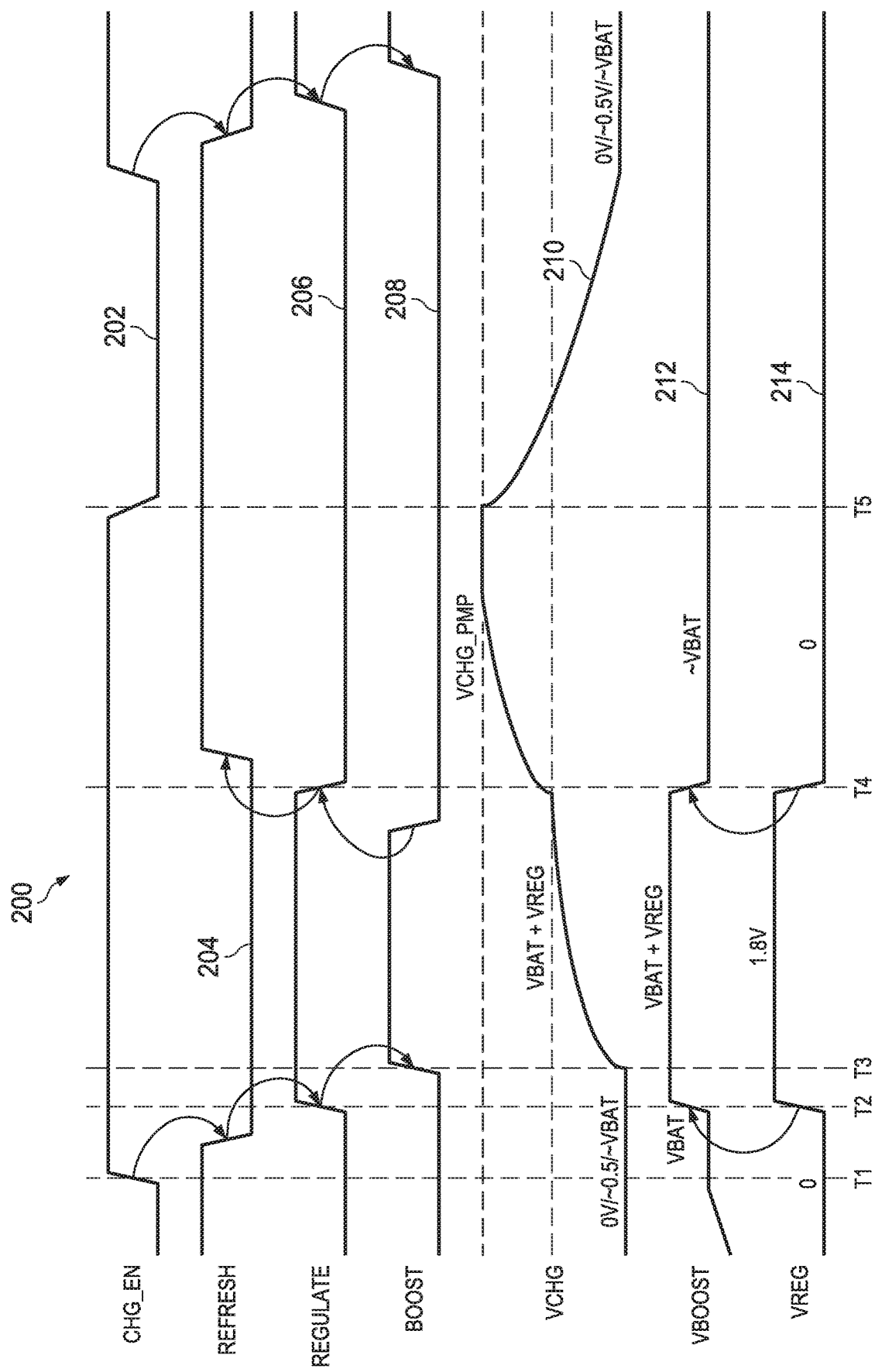
FIG. 2 depicts a signal diagram demonstrating an example of signals during operation of the circuit of FIG. 1.

As a further example, FIG. 2 depicts a signal timing diagram 200 for demonstrating operation of the system 100 of FIG. 1. In the example of FIG. 2, the signals include a charge enable (CHG_EN) signal 202 corresponding to the signal CHG_EN provided to the input of the charge pump 116 and to the timing control circuit 120. The diagram 200 also includes control signals provided by the timing control circuit 120 including REFRESH signal 204, REGULATE signal 206 and BOOST signal 208, as described with respect to FIG. 1. The diagram 200 of FIG. 2 also depicts a charge voltage (VCHG) 210, corresponding to the voltage at the CHG node 114, a boost voltage (VBOOST) 212 corresponding to the voltage at the terminal 106, and the regulated voltage VREG 214 corresponding to the voltage supplied by the voltage regulator 130 to the terminal 108.

By way of example, in response to the CHG_EN signal 202 going high at time T1, the timing control circuit 120 is configured to provide the REFRESH signal 204 (e.g., a logic low) to turn off the refresh switch 122. Prior to and during T1, when the CHG_EN signal 202 is asserted, the refresh switch 122 is turned on such that the battery voltage VBAT is supplied to the boost capacitor 104. The battery voltage VBAT is provided at the terminal 106 to charge the boost capacitor 104 to the voltage VBAT. In response to the REFRESH signal going low, the refresh switch 122 is opened to disconnect the supply of the battery voltage VBAT from the boost capacitor 104. Upon turning off of the refresh switch 122, at time T2, the timing control circuit 120 is further configured to provide the REGULATE signal (e.g., at a logic high) for activating the voltage regulator 130 to supply VREG to the terminal 108 such that the voltage at terminal 106 increases from the target voltage VBAT to an aggregate voltage of VBAT+VREG.

At time T3, following the application of VREG to the boost capacitor 104, the timing control circuit 120 is configured to provide the BOOST signal 208 (e.g., a logic high) to turn on the boost switch 112. In response to turning on the boost switch 112, the voltage at the CHG node 114, demonstrated at the signal VCHG 210, rises until it reaches the level of VBAT+VREG, which represents the VBOOST signal 212 at the terminal 106. After a duration, which may be programmable, the timing control circuit 120 changes the state of the BOOST signal 208 (e.g., to logic low), which causes the boost switch 112 to turn off and disconnect the boost voltage VBOOST from the output 118 of the charge pump 116. The charge pump 116 can continue to supply the charge pump voltage at its output 118 for the duration until the CHG_EN signal is de-asserted (e.g., to logic low) at time T5. Prior to time T5, at time T4, timing control circuit 120 changes the state of the REGULATE signal 206 (e.g., to logic low), which deactivates the voltage regulator 130 and results in the boost voltage at terminal 106 decreasing by VREG. Following the deactivation of the voltage regulator, the timing control circuit 120 changes the state of the REFRESH signal 204 (e.g., to logic high) to continue pre-charging the boost capacitor 104 to VBAT through the refresh device 122.

At time T5, when the CHG_EN signal changes state (e.g., to a logic low) to disable the charge cycle, the charge voltage VCHG 210 at the CHG node 114 decreases. The level to which the charge voltage VCHG 210 settles depends on the pull-down mode implemented by the system 100. For example, in a first operating mode, the pull-down circuit 128 is configured to implement a soft pull-down in which the voltage at the CHG terminal 114 is discharged to a target voltage (e.g., VBAT). In a second operating mode, the pull-down circuit 128 is configured to implement a hard pull down in which the CHG terminal 114 is discharged to approximately to a system ground voltage (e.g., zero volts). As disclosed herein, the particular mode is selected based on the value of the EN_PD signal provided by the timing control circuit 120 to the pull-down circuit 128. In an example, the target voltage for the pull-down circuit is the same as the target voltage to which the boost voltage is refreshed, namely, the target voltage approximates the battery voltage VBAT, and the regulate voltage may correspond to a threshold voltage sufficient to turn on the transistor 110. Other voltage values may be used in other examples.

Figure 3:
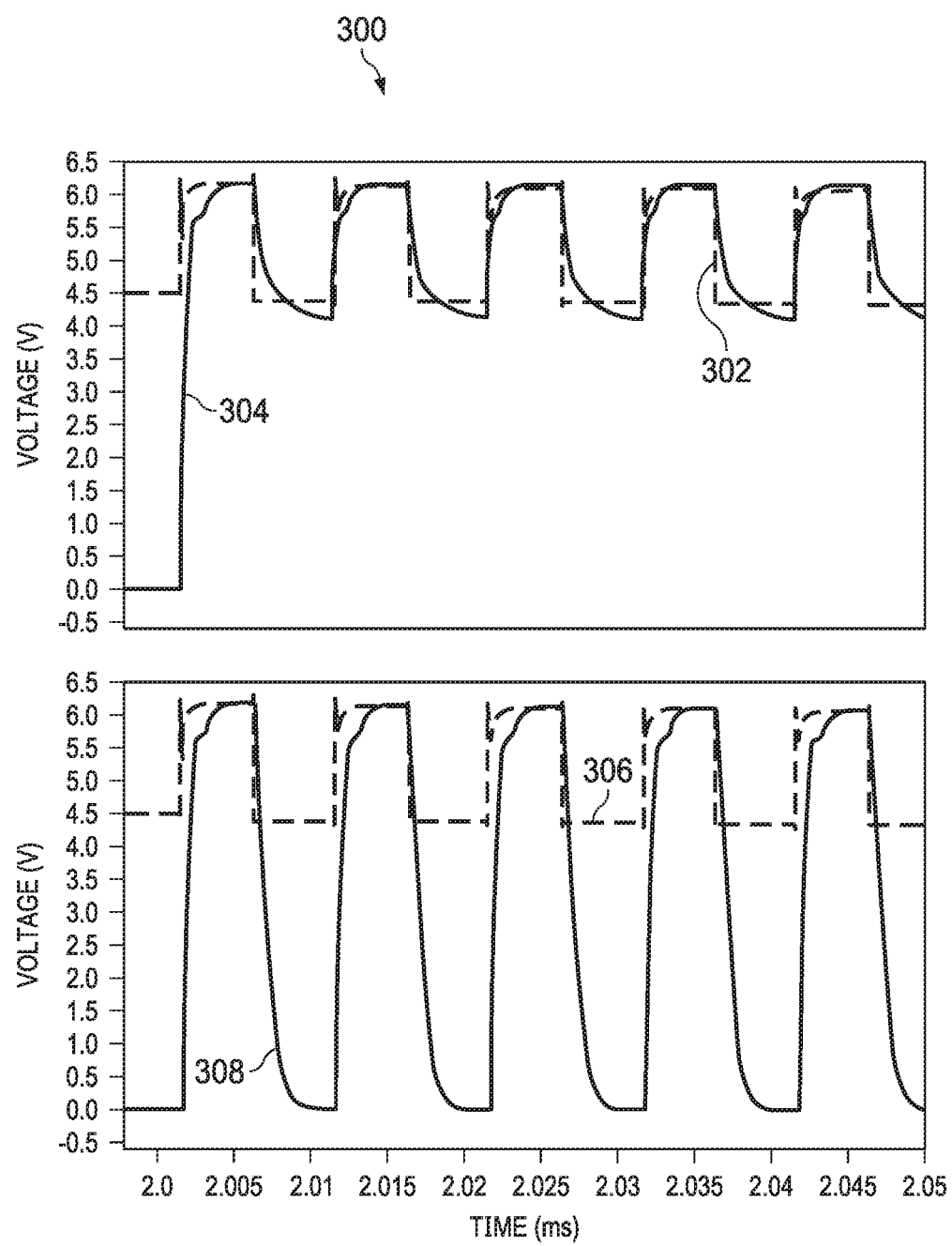
FIG. 3 is a signal diagram showing a comparison of boost and charge voltages with different discharge levels over a number of charge cycles.

FIG. 3 is a signal diagram 300 of the voltages at terminals 106 and 114 over a number of charge cycles for different pull-down modes. In particular, the diagram 300 includes a boost voltage signal 302 representing the voltage at terminal 106 of the circuit 100 and a charge signal 304 representing the voltage at the CHG terminal 114 for a soft-pull down mode, such as implemented by pull-down circuit 128. Thus, for the initial application of the boost voltage 302 that is applied to the CHG terminal 114, the charge voltage 304 increases to about 6.4 volts and then decreases down to about 4.2 volts. This process repeats throughout the remaining cycles illustrated in the signal diagram 300. As disclosed with respect to FIG. 1, the charge voltage does not decrease beyond about 4.2 volts because the pull-down circuit 128 is configured to clamp the voltage at 114 to the target voltage, which in this example is about 4.2 volts (e.g., approximating the battery voltage VBAT).

By contrast, for the example where the pull-down circuit 128 is configured to perform a hard pull down, the diagram 300 illustrates a boost voltage signal 306 representing the voltage at terminal 106 of the circuit 100 and a charge signal 308 representing the voltage at the CHG terminal 114. In this example, the boost voltage at the terminal 106 increases and decreases over each charge cycle between about 6.4 and 4.5 volts, which is similar to boost voltage signal 302. However, the voltage at the charge node 114 decreases to about 0 volts with each cycle. As a result of implementing the hard pull down for the CHG terminal, the charge pump 116 will be unable to quickly turn on the transistor 110 that is coupled to the CHG terminal 114 over a number of repeated charge cycles. That is, with each cycle when a hard pull down is implemented, it takes longer to increase the voltage at the CHG terminal 114 for turning on the charge transistor.

Figure 4:
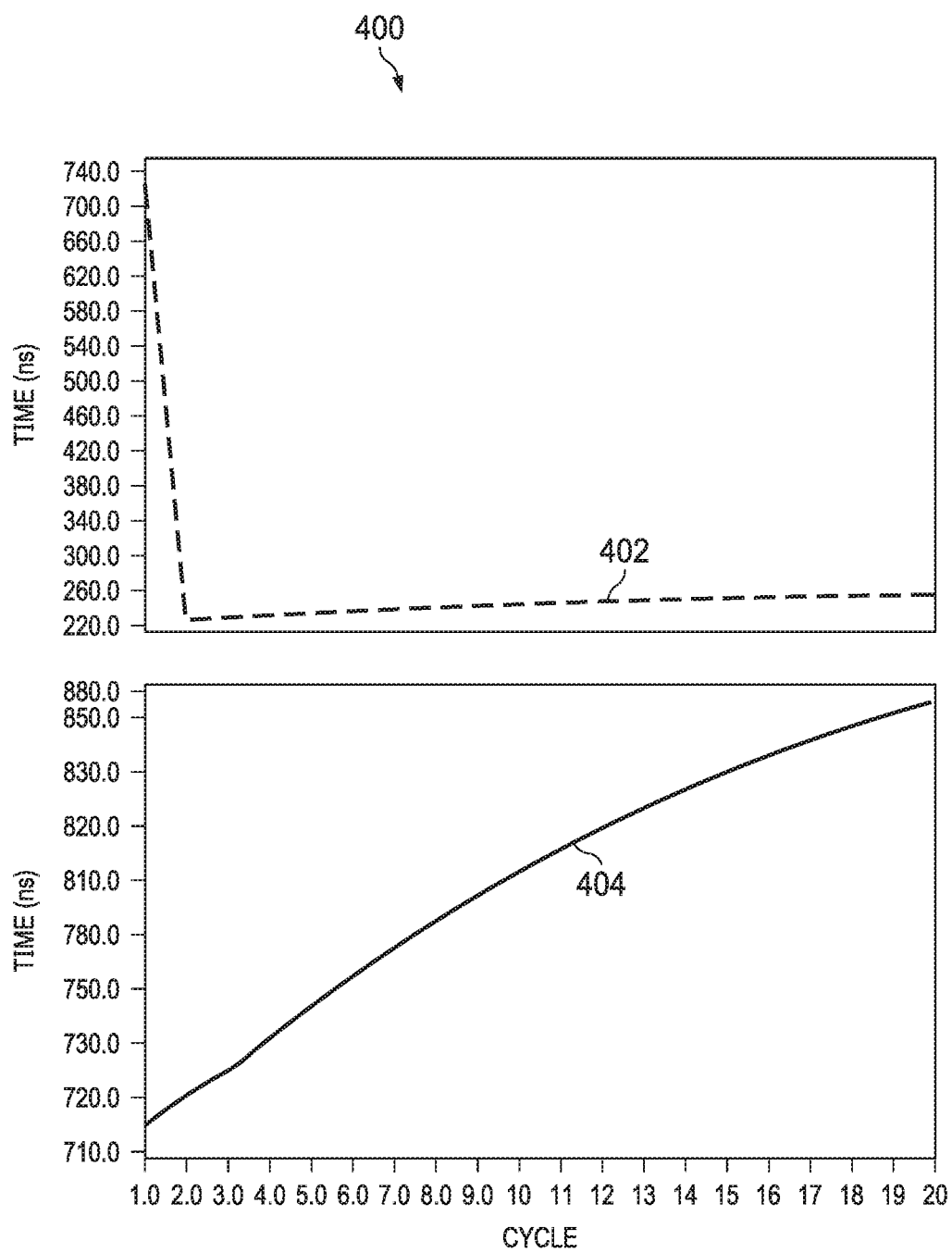
FIG. 4 is a plot of demonstrating a comparison of sequence timing intervals for the different discharge levels illustrated in FIG. 3.

The relationship of charge timing over a number of cycles for the different pull-down modes is further demonstrated in the timing diagram 400 of FIG. 4. In the example of FIG. 4, time (on the Y-axis) is plotted as a function of the number of cycles (on the X-axis). The timing diagram 400 includes a first plot 402 showing the charge time for sequential timing according to the scenario in FIG. 3 performing a soft pull down (e.g., to a target voltage) for each cycle. As shown, the first cycle exhibits an increased amount of time for charging the CHG terminal 114, and the charge time significantly reduces for the second and each subsequent cycle. By way of contrast, a second plot 404 illustrates the charge time for sequential timing according to the scenario in FIG. 3 performing a hard pull down (e.g., to 0 volts) for each cycle. In the case of performing a hard pull down, the charge time increases for the second and each subsequent cycle. Therefore, at some point in time, after a certain number of repeated cycles, the system will be unable to sufficiently charge the CHG terminal 114 to enable the transistor to turn on. Advantageously, the system can implement a soft pull down to enable the transistor to be turned on for each of a plurality of cycles in a given sequence.

Figure 5:
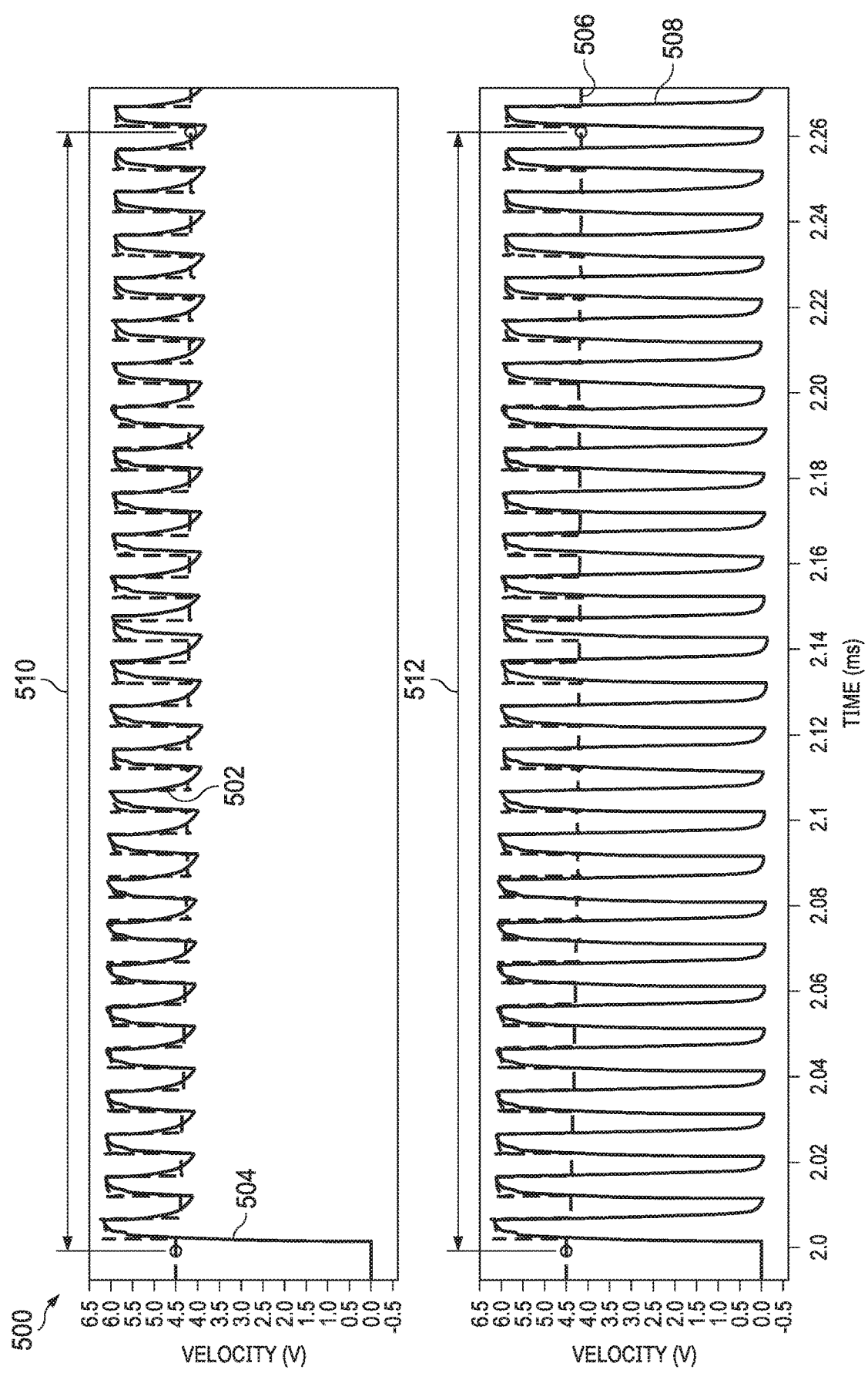
FIG. 5 is a signal diagram showing a comparison of boost and charge voltages with different discharge levels over a plurality of charge cycles.

FIG. 5 is a signal diagram 500 similar to FIG. 3 but over a time interval that includes a greater number of cycles. That is, the diagram 300 shows the voltages at terminals 106 and 114 over a large number of charge cycles for different pull-down modes. The top plots 502 and 504 represent the voltages at 106 and 114, respectively, for a soft-pull down mode. The bottom plots 506 and 508 represent the voltages at 106 and 114, respectively, for a hard-pull down mode.

Horizontal lines 510 and 512 demonstrate a fixed reference voltage level in each of the plots. For the case where pull-down circuitry 128 is configured to implement a soft pull-down, a difference between line 510 and the lower level of the boost voltage (at terminal 106) remains fixed. This demonstrates that for each cycle, the boost capacitor 104 does not lose charge, but instead holds a fixed voltage, namely, the target voltage (e.g., VBAT) over each cycle. In contrast, for the example where a hard pull down is implemented by pull-down circuit 128, the lower level for the voltage signal 506 (at terminal 106) steadily decreases over time. That is, for each subsequent cycle, the boost capacitor 104 loses some charge such that its lower voltage droops over time. Therefore, as a result of implementing the hard pull down, the performance decreases over a plurality of cycles such that the system is unable to maintain a desired fast turn on time for the charge transistor 110 that is coupled to the switch CHG terminal 114 over a number of repeated charge cycles. Soft pull down may be implemented when repeated charge cycles occur to reduce or eliminate the voltage droop across the boost capacitor and enable increase performance (e.g., faster charge time) over the repeated turn-on cycles for the transistor 110.

Figure 6:
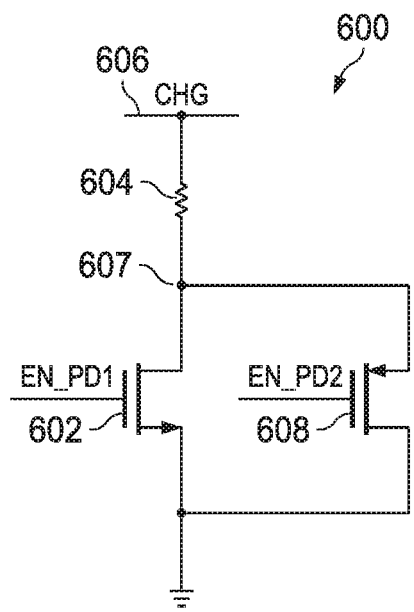
FIG. 6 is an example of a pull-down circuit.
Figure 7:
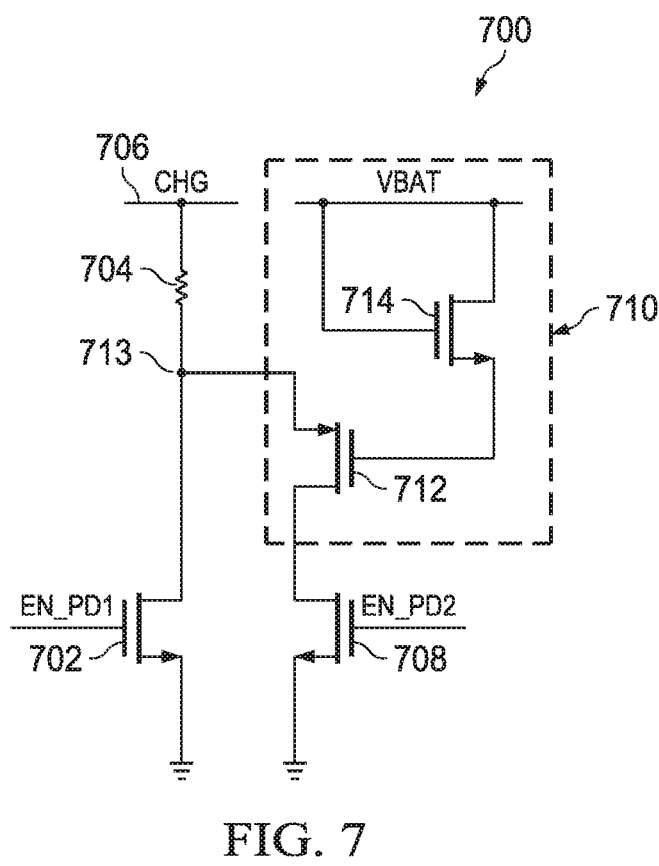
FIG. 7 depicts an example of another pull-down circuit.

FIGS. 6 and 7 illustrate examples of pull-down circuits 600 and 700, respectively, which may be implemented as the pull-down circuit 128 of FIG. 1. In the example of FIG. 6, the pull-down circuit 600 includes an NMOSFET 602 coupled in series with a resistor 604 between a CHG node 606 (corresponding to CHG node 114 of FIG. 1) and electrical ground. A node 607 between the resistor 604 and the drain of NMOSFET 602 is connected to the source of a PMOSFET 608. The PMOSFET 608 thus is coupled between the node 607 and electrical ground. Respective enable signals EN_PD1 and EN_PD2 are provided to the gates of each of the NMOSFET and PMOSFET devices 602 and 608, respectively, to control the pull-down circuit 600 in a corresponding operating mode. For example, the EN_PD1 and EN_PD2 signals are logic signals provided by timing control circuit 120, such as may be independently controllable or be provided inverted versions of each other (e.g., EN_PD1=!EN_PD2). In an example for implementing a first pull-down operating mode (e.g., a hard pull down), the EN_PD1 will toggle between low and high at the gate of the NMOSFET 602 while EN_PD2 will be kept at logic high at the gate of PMOSFET 608 such that the CHG node 606 is discharged by pulling the node 607 down to electrical ground through the resistor 604 and the NMOSFET 602. The circuit 600 operates in second operating mode (e.g., soft pull down) when the EN_PD1 signal is provided at a second state (e.g., at logic low) and the EN_PD2 signal is provided to toggle between logic states (e.g., toggle between logic high and low) at the gate of FET 608 in which the voltage at the node 607 is clamped according to the voltage drop across the PMOSFET 608 such that CHG node 606 discharges to the clamp voltage. The clamp voltage may be set according to the size of the PMOSFET 608.

In the example of FIG. 7, the pull-down circuit 700 includes an NMOSFET 702 connected in series with a resistor 704 between the CHG node 706 and electrical ground. The pull-down circuit 700 also includes the clamp circuit 710 that is connected between a terminal, which has a target voltage VBAT, and electrical ground. The clamp circuit 710 includes a NMOSFET 708 connected with a PMOSFET 712. The drain of the NMOSFET 708 is coupled to the drain of the PMOSFET 712, and a node 713 between resistor 704 and NMOSFET 702 is coupled to the source of the PMOSFET 712. A diode is coupled between VBAT and the gate of PMOSFET 712. In the example of FIG. 7, the diode is demonstrated as a diode-connected NMOSFET 714.

To operate in a first operating mode (a hard pull down mode), the EN_PD1 is provided (e.g., by timing control circuit 120) with a first mode to toggle between logic states (e.g., to toggle between logic low and high) and the EN_PD2 signal has a set state (e.g., logic low). In the hard pull down mode, the NMOSFET 702 is turned on to pull the node 713 to electrical ground, which results in discharging the CHG node 706 through the NMOSFET 702 to about 0 volts. In the hard pull down mode, the NMOSFET 708 is turned off. The circuit 700 operates in second operating mode (e.g., soft pull down) by keeping the EN_PD1 in a first state (e.g., logic low) while EN_PD2 toggles between logic states (e.g., toggles between logic low and high).

In the soft pull down mode, the NMOSFET 702 is turned off and the EN_PD2 signal turns on the NMOSFET 708. In response, the clamp circuit 710 is activated to clamp the voltage at the node 713 to approximate VBAT. As a result, the CHG node 706 discharges to approximate VBAT during the soft pull down mode.

Figure 8:
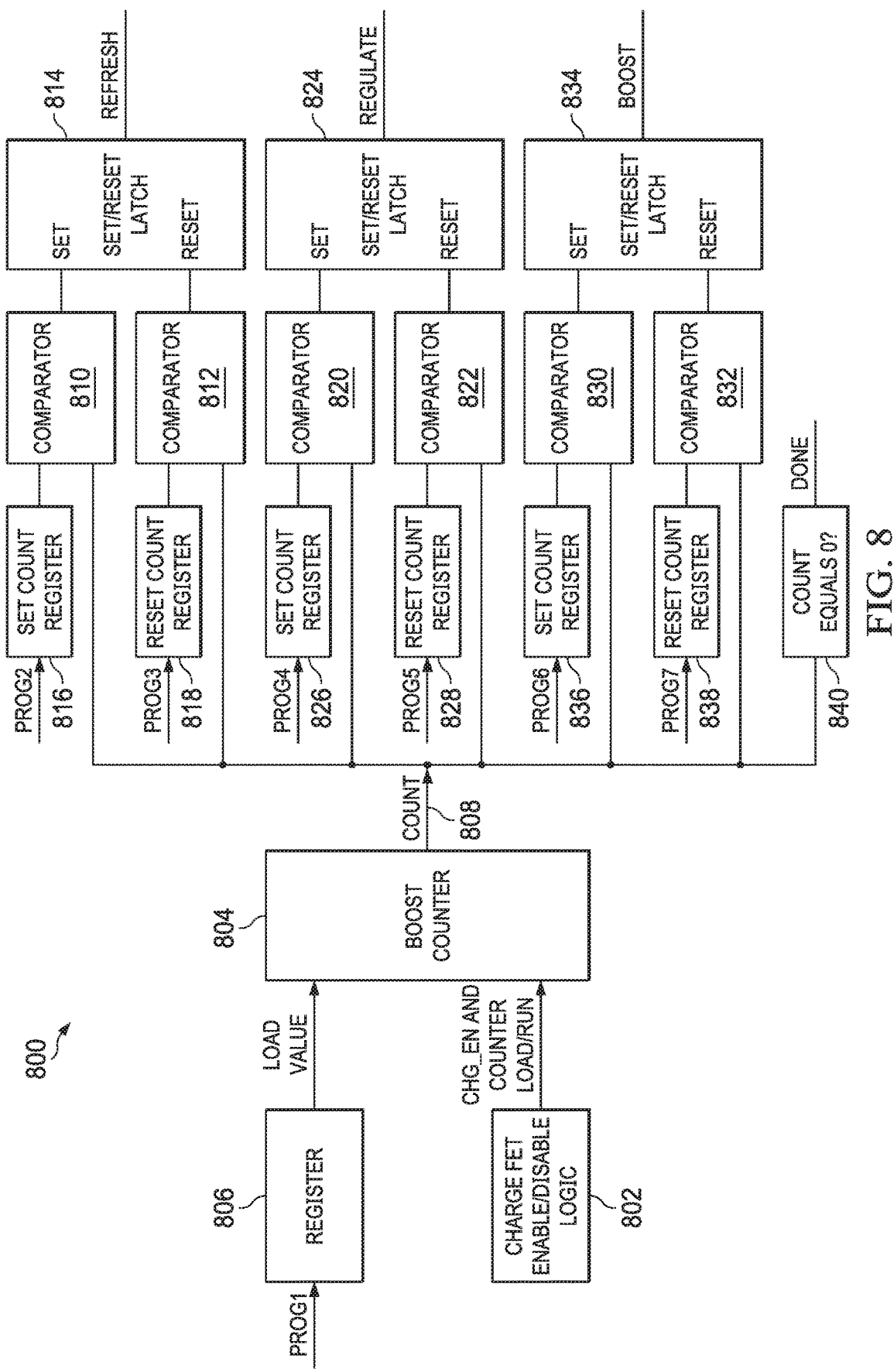
FIG. 8 depicts an example of timing logic for providing control signals.

FIG. 8 depicts an example of a boost sequence logic circuit, such as may be implemented by the timing control circuit 120 of FIG. 1. The logic circuit 800 includes a charge FET enable/disable logic circuit 802 that is configured to provide a charge enable (CHG_EN) signal, such as corresponding to CHG_EN signal of FIG. 1, and a counter load to a boost counter 804. For example, the logic 802 enables the boost counter to count down from a count value based on a load value stored in a register 806. For example, the register 806 is programmed in response to a program signal PROG1 to load a corresponding load count value into the boost counter 804 in response to the load signal from the logic 802. The count value may be programmable according to a duration that is to be implemented for each charge cycle. While a counter is shown in the example of FIG. 8, in other examples, a timer (e.g., analog or digital timer) could be used.

In response to the CHG_EN signal being provided by the logic 802 with a first state (e.g., logic high), the boost counter 804 begins to count down from the initial value loaded from the register 806. For example, the boost counter 804 counts down from the initial value at a rate based on a clock signal (not shown). The boost counter 804 is configured to provide a count value at an output 808 thereof that is coupled to an arrangement of cycle control circuitry that is configured to provide the respective control signals for implementing the boost function for each charge cycle as disclosed herein. In the example of FIG. 8, the counter output 808 is coupled to provide the current count value to inputs of a set of comparators.

By way of example, refresh cycle control circuitry includes comparators 810 and 812 having inputs coupled to receive the count value and respective outputs coupled to set and reset inputs of a set/reset (SR) latch 814. The comparator 810 compares the count value at 808 with respect to a set count value that is provided by a set count register 816. The set count register 816 may be programmed in response to a program signal PROG2 to set the count value provided to another input of the comparator 810. The comparator 810 is configured to compare the count value provided at 808 with the set count value provided by the register 816 and to provide a comparator output signal (e.g., to assert or de-assert) the set input of SR latch 814. The comparator 812 is configured to compare the count value at 808 with the output of a reset count register 818 and to provide a comparator output signal (e.g., to assert or de-assert) to the reset input of SR latch 814. The reset count register 818 can be programmed with a value in response to a PROG3 input. The SR latch 814 is configured to provide the REFRESH signal based on the set and reset inputs provided by the respective comparators 810 and 812. For example, in response to the set input of the SR latch 814 being logic high, the REFRESH signal is set to logic high until the reset input is set logic high, which causes the SR latch 814 to de-assert the REFRESH signal to a logic low.

The circuit 800 also includes regulate cycle control circuitry that includes comparators 820 and 822 having inputs coupled to receive the count value. Each of the comparators 820 and 822 have respective outputs coupled to set and reset inputs of an SR latch 824. The comparator 820 compares the count value at 808 with a set count value that is provided by a set count register 826. The value of the set count register 826 may be programmed in response to a program signal PROG4, which sets the count value provided to another input of the comparator 820. The comparator 820 thus is configured to compare the count value provided at 808 with the set count value from the register 826 and to provide a comparator output signal to the set input of SR latch 824. The comparator 822 is configured to compare the count value at 808 with the output of a reset count register 828 and to provide a comparator output signal to the reset input of SR latch 824 based on the comparison. The reset count register 828 may be programmed with a value in response to a PROGR5 input signal. The SR latch 824 is configured to provide the REGULATE signal based on the signals provided by comparators 820 and 822 to the respective set and reset inputs. For example, in response to the set input of the SR latch 824 being logic high, the REGULATE signal is set to logic high until the reset input is set logic high, at which time the SR latch 824 changes the state of the REGULATE signal to a logic low.

The circuit 800 also includes boost cycle control circuitry that includes comparators 830 and 832 having inputs coupled to receive the current count value at the output 808. Each of the comparators 830 and 832 has a respective output coupled to set and reset inputs of an SR latch 834. A set count register 836 may be programmed in response to a program signal PROG4 to sets a count value that is provided to another input of the comparator 830. The comparator 830 thus is configured to compare the count value provided at 808 with the set count value from the register 836 and to provide a comparator output signal to the set input of SR latch 834. A reset count register 838 may be programmed with a value in response to a PROGR5 input signal. The comparator 832 is configured to compare the count value at 808 with the output of the reset count register 838 and to provide a comparator output signal to the reset input of SR latch 834 based on the comparison. The SR latch 834 is configured to provide the BOOST signal based on the signals provided by comparators 830 and 822 to the respective set and reset inputs. For example, in response to the set input of the SR latch 834 being logic high, the BOOST signal is set to logic high until the reset input is asserted by the comparator 832, at which time the SR latch 834 changes the state of the BOOST signal to a logic low.

Additional logic 840 is configured to determine when the count value at 808 is equal to zero, indicating that the counter has expired (e.g., timed out). In response to the count value equaling zero, the logic 840 is configured to assert a DONE signal to specify that the boost cycle has completed. For example, the DONE signal is applied to force the EN_PD1 to logic high and to void the effect of the EN_PD2 signal that is being provided.

Figure 9:
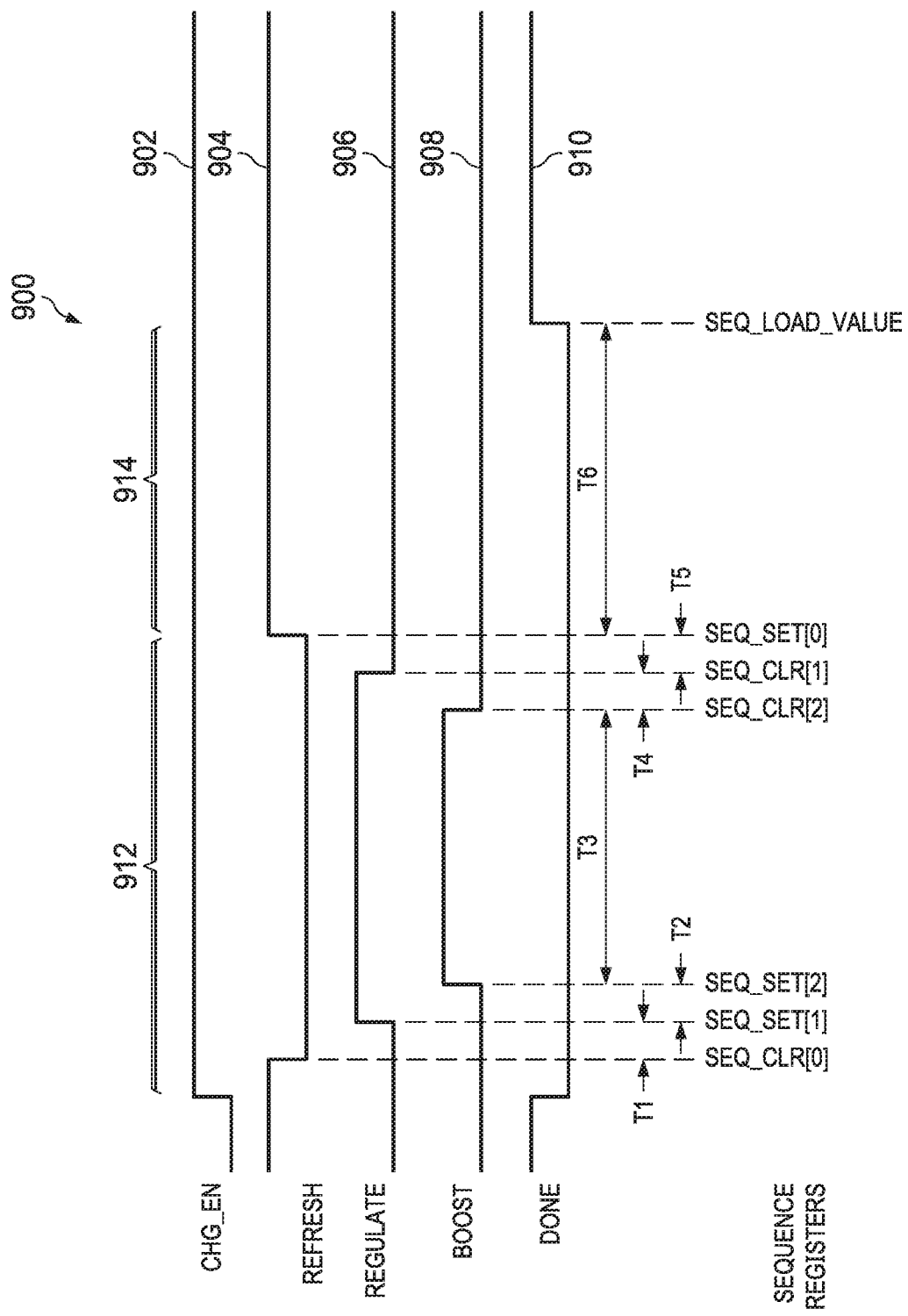
FIG. 9 depicts an example of a signal timing diagram for the control signals generated by the logic of FIG. 8.

FIG. 9 depicts a timing diagram demonstrating an example of logic control signals generated by the logic circuit of FIG. 8. The timing diagram 900 includes examples of the CHG_EN signal 902 provided by logic 802, a REFRESH signal provided by SR latch 814, a REGULATE signal provided by SR latch 824, a BOOST signal 908 provided by latch 834 and a DONE signal 910 provided by logic 840. As explained with respect to FIG. 8, the duration and relative timing of each of the signals 902, 904, 906, 908 and 910 are programmable (e.g., in response to signals PROG1, PROG2, PROG3, PROG4, PROG5, PROG6 and PROG7). By allowing one or more of such timing parameters to be programmable (through setting of register 806, 816, 818, 826, 828, 836 and 838) the systems and methods disclosed herein can implement flexible wave form generation to enable use of system 100 in various different use environments. For example, the actual values utilized may be defined based on analog timing requirements for the charge circuit.

As shown in FIG. 9, a sequence of the signals 904, 906 and 908 is triggered in response to the CHG_EN signal 902. A boost sequence 912 includes the REFRESH signal 904 being reset to logic low and, after a time interval T1, the REGULATE signal 906 is set logic high. After a duration T2 from the REGULATE signal going high, the BOOST signal is also set to logic high for a time interval indicated at T3.

The timing between the respective signals being set to logic high or low can be established based upon the programmable registers (e.g., registers 816, 816, 826, 828, 836 and 838), as disclosed herein. When the interval T3 ends, the BOOST signal is reset to logic low. In response and after a time interval T4, the REGULATE signal is also reset to logic low. Then, after a subsequent interval in the sequence denoted as T5, the REFRESH signal is set again to logic high. After the boost counter has reached zero, demonstrated as time interval T6, the logic 840 sets the DONE signal 910 to logic high. As disclosed herein, time interval T6 thus corresponds to a refresh portion 914 of the charge cycle that is used for pre-charging the boost capacitor 104 to the target voltage (e.g., VBAT) to enable fast turn on of the transistor 110 in the next charge cycle. Once the boost capacitor has been pre-charged at the end of duration T6, the boost circuit is ready for the next cycle, which may include execution by the logic circuit 800 to provide corresponding timing control signals to implement the boost sequence for each subsequent cycle.

Figure 10:
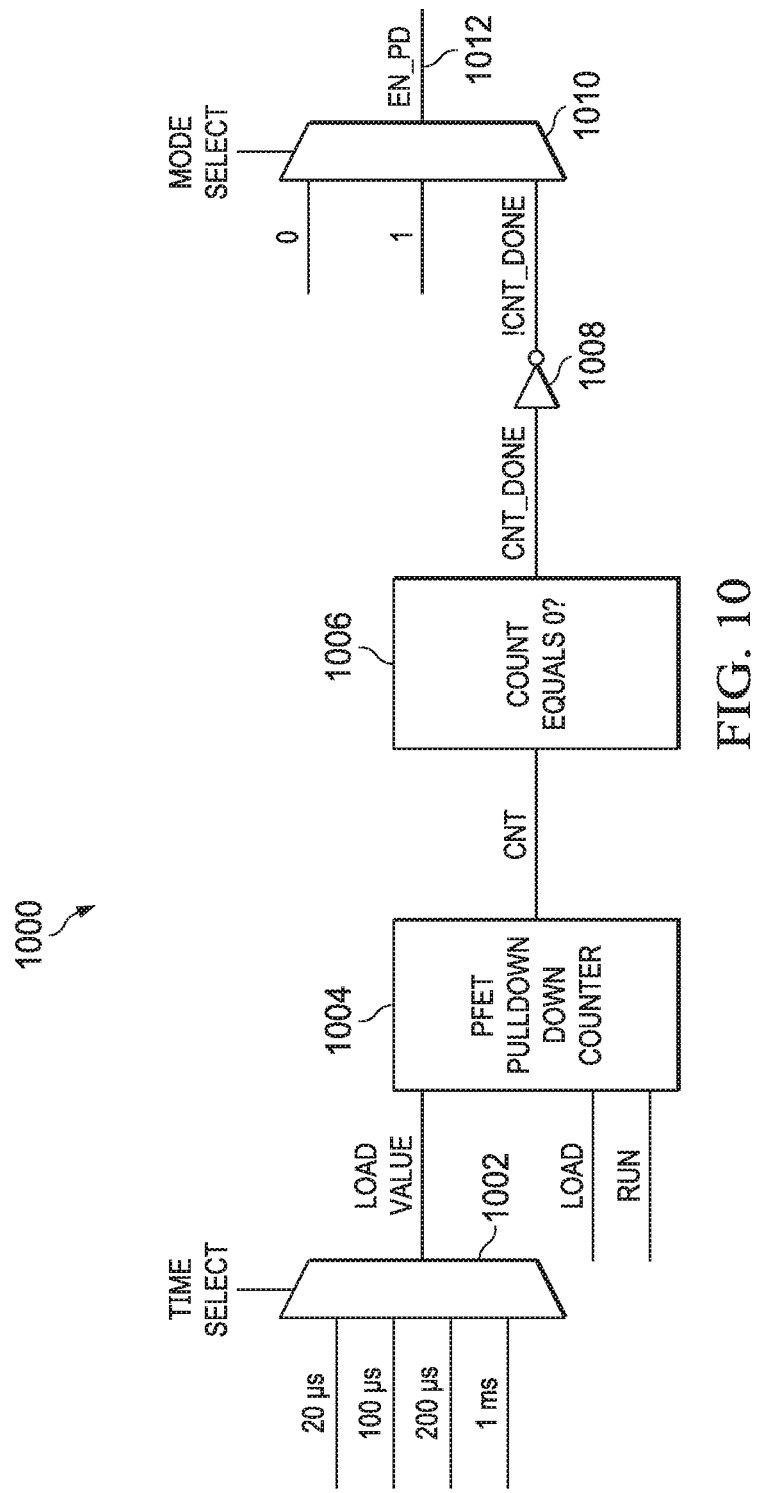
FIG. 10 depicts an example of a logic circuit for controlling pull-down circuitry for each boost sequence.

FIG. 10 depicts an example of pull-down mode control logic 1000 configured to provide EN_PD signals for controlling pull-down circuitry, such as the pull-down circuit 128 of FIG. 1 or pull-down circuitry 600 and 700 of FIGS. 6 and 7, respectively. As disclosed herein, the mode control logic 1000 may be implemented as part of the timing control circuit 120 or the logic may be implemented separately from the timing control circuit.

In the example of FIG. 10, the logic 1000 incudes a multiplexer 1002 configured to select a time interval to set a duration of the pull-down function, which may vary according to the analog timing requirements of the charge circuitry. In the example of FIG. 10, the multiplexer includes a plurality (e.g., four) of time inputs, each receiving a different time value ranging between 20 microseconds through 1 millisecond. Different time values and/or a different number of time inputs may be used in other examples. In yet another example, a continuous variable time value may be set and provided in response to the time select input. The multiplexer 1002 provides a selected time value to an input of pull-down counter 1004 based on the time select input. The pull-down counter 1004 is similar to counter 804. In response to the selected time value, a value is loaded into the counter 1004 for setting a counter value representative of the selected time value. The counter 1004 also includes a LOAD input to trigger the counter to load the value from the multiplexer 1002 as well as a RUN input to enable the pull-down counter to count down from the loaded count value, such as based on a corresponding clock signal (not shown). The counter 1004 is configured to decrement the counter value and provide the current count value to a comparator function 1006. In another example, instead of using a counter, an analog or digital timer may be implemented to provide a similar timer function. The comparator 1006 is configured to select the EN_PD output based on the count value. In response to the EN_PD signal from the comparator will set correct logic values of the pull down enable signals EN_PD1 and EN_PD2 such as disclosed herein.

The comparator function 1006 is configured to determine whether the count value has reached zero (or timer has expired). In response to determining that the count value has reached zero, the comparator function 1006 provides an output (e.g., having logic value) to specify when the counter has reached zero. The comparator output may be provided to an input at an inverter 1008. The inverter 1008 is configured to invert the comparator output and provide a corresponding inverted version of the comparator output to an input of a multiplexer 1010. The multiplexer 1010 is a pull-down mode selector configured to select between different pull-down modes. For example, the input from the inverter 1008 provides a selected duration for performing the pull down operation while the other inputs can set other pull-down modes such as to set a hard pull-down or to implement a constant soft pull-down that does not end. The multiplexer 1010 thus provides one or more EN_PD signals at an output 1012, such as the EN_PD signal provided to an input of the pull-down circuit 128 as well as the EN_PD1 and EN_PD2 signals provided to the control input of devices 602, 608 and 702, 708 of FIGS. 6 and 7, respectively.

Figure 11:
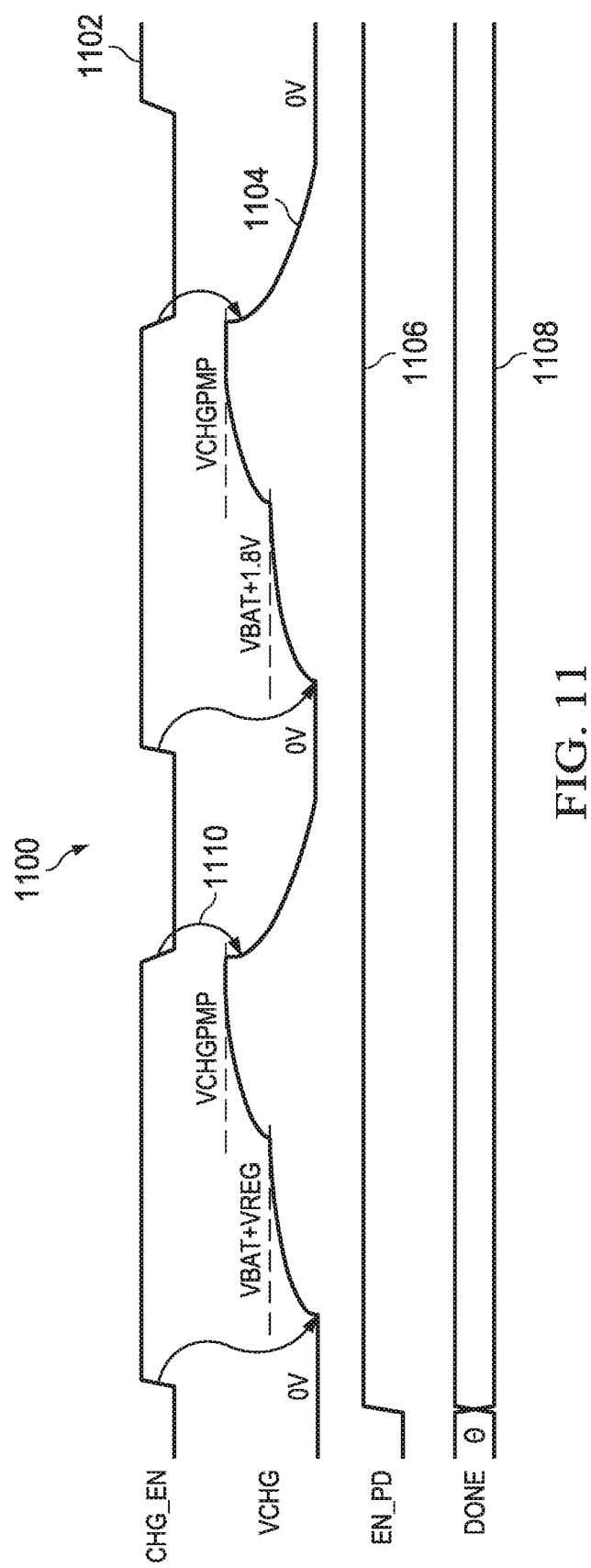
FIG. 11 depicts an example of a signal timing diagram for a first pull-down condition.
Figure 12:
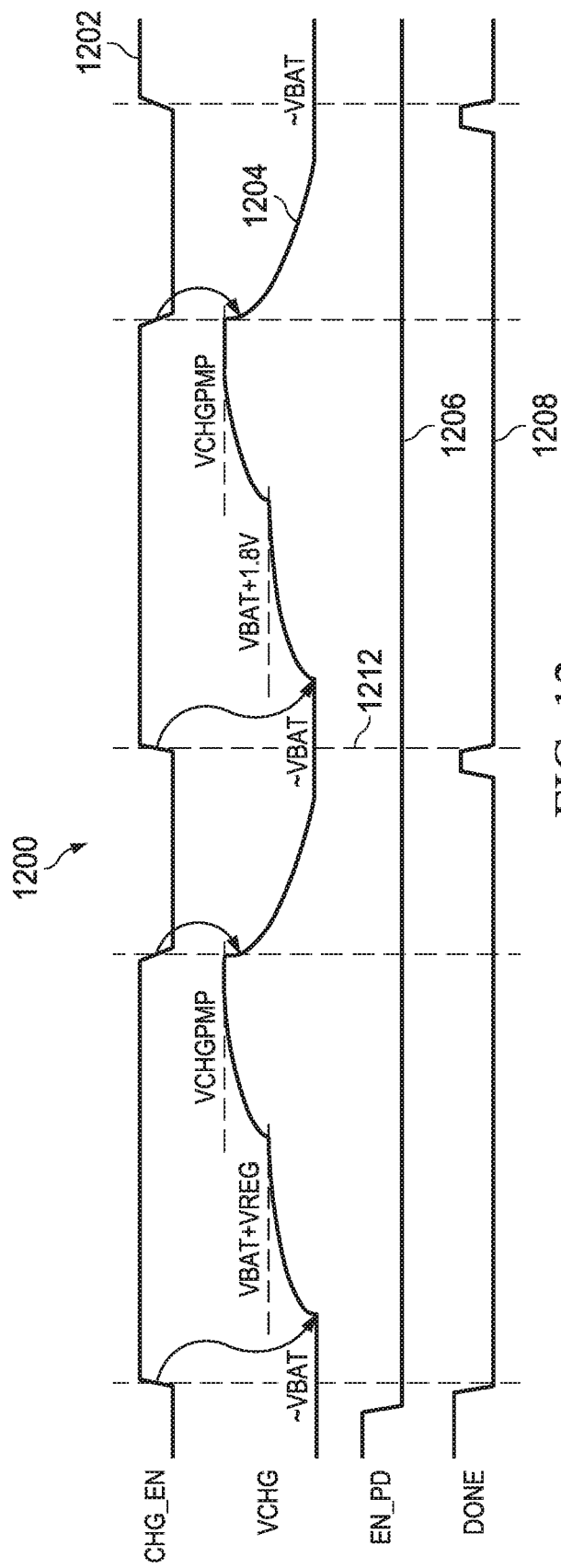
FIG. 12 depicts an example of a signal timing diagram for a second pull-down condition.
Figure 13:
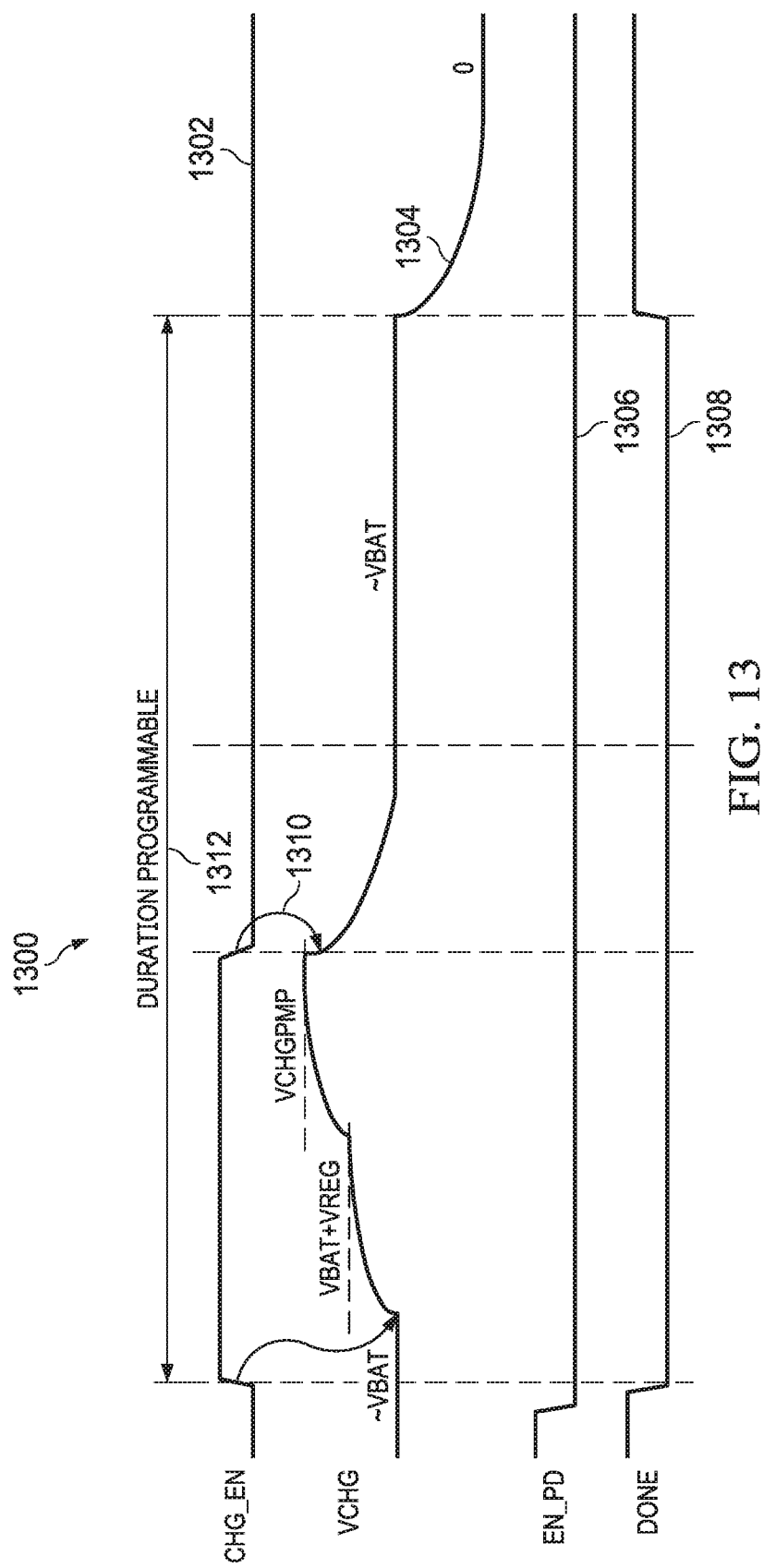
FIG. 13 depicts an example of a signal timing diagram for a third pull-down condition.

By way of further example, FIGS. 11, 12 and 13 are signal timing diagrams illustrating operation of a fast charge circuit (e.g., circuit 100) for different pull-down modes that could be selected by the logic 1000 of FIG. 10. The same signals are shown in each of FIGS. 11, 12 and 13 for the different pull-down modes. While three examples of pull-down modes are shown, different timing relationships could be implemented from the particular examples shown.

FIG. 11 depicts an example of signal diagram 1100 for a first operating mode in which at the pull-down circuit is configured to implement a hard pull down mode. In this example, the timer value does not matter because a hard pull is implemented with each cycle regardless of the count value provided by the counter 1004. The signal diagram 1100 includes a CHG_EN signal 1102 provided by logic 802, a charge voltage (VCHG) signal 1104 (at CHG node 114) as well as timing signals corresponding to the EN_PD1 and the DONE signals. Similar to the signal diagram of FIG. 2, in response to the CHG_EN signal 1102 going high, the charge voltage VCHG increases initially to VBAT+VREG (e.g., by coupling the pre-charged boost capacitor to the CHG node 114), such as until the charge pump is operative to further increase the voltage to the charge pump voltage (VCHGPMP). At 1110, when the charge enable goes low, the charge voltage is pulled to ground (e.g., 0 volts) and the process repeats for the next charge cycle. In this example, the EN_PD signal 1106 is set to pull the voltage VCHG (at the CHG node 114) to ground, such as may be implemented by turning on the NMOSFET 602 or NMOSFET 702 in the examples of FIG. 6 or 7, respectively.

FIG. 12 illustrates an example of a signal diagram 1200 for a second operating mode in which a continuous soft pull-down is implemented. The signal diagram 1200 includes the same signals as FIG. 11, namely, a CHG_EN signal 1202, a charge voltage VCHG signal 1204, an EN_PD signal 1206 and a DONE signal 1208. In this example, in response to the CHG_EN signal 1202 going high, the charge voltage VCHG increases as in FIG. 11, by increasing first to the aggregate pre-charge voltage of VBAT+VREG and then to the charge pump voltage VCHGPMP. In response to the CHG_EN signal going low, the charge voltage VCHG decreases to a target voltage VTGT (e.g., approximating VBAT). When the cycle has ended, the DONE signal is asserted as a pulse, which results in beginning the next charge cycle at 1212 and the CHG_EN signal changes state to logic high. In this example, where the soft pull-down is always implemented, the DONE signal does not time out before a timer reset is activated to trigger the next cycle. Additionally, the DONE pulse in the middle is provided to reset to enable counting again.

FIG. 13 is a signal diagram 1300 that illustrates an example of another operating mode in which the soft pull-down mode is being implemented with a programmable duration. The programmable duration may be set by selecting a time value at multiplexer 1002. The signal diagram 1300 includes the same signals as FIG. 11, namely, a CHG_EN signal 1302, a charge voltage VCHG signal 1304, an EN_PD signal 1306 and a DONE signal 1308. In the example of FIG. 13, similar to FIGS. 11 and 12, in response to the CHG_EN signal 1302 being asserted logic high, the charge voltage increases first to the aggregate pre-charge voltage of VBAT+VREG and then to the charge pump voltage VCHGPMP for turning on the transistor. After the state of the CHG_EN signal changes to logic low at 1310, the charge voltage VCHG decreases to a target voltage (e.g., approximately VBAT). After a programmable duration, demonstrated at 1312, the DONE signal 1308 is asserted to logic high in response to the counter expiring. The assertion of the DONE signal 138 triggers a transition from the soft pull-down mode to the hard pull-down mode to implement further discharge of the charge voltage VCHG at the CHG node down to electrical ground (e.g., 0 volts).

Figure 14:
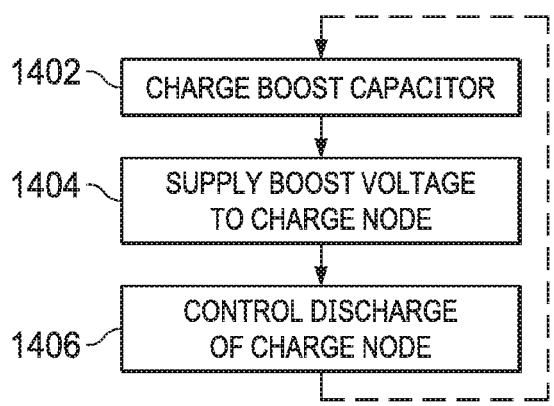
FIG. 14 is a flow diagram depicting an example of a method to control turn on of a transistor.

In view of the structural and functional features described above, certain methods will be better appreciated with reference to FIG. 14. The illustrated actions, in other embodiments, may occur in different orders or concurrently with other actions from that illustrated. Moreover, not all features illustrated in FIG. 14 may be required to implement a method. FIG. 14 is a flow diagram depicting an example of a method 1400 to control turn on of a transistor such as implemented as transistor 110 in the system 100 FIG. 1. At 1402, the method 1400 includes charging a boost capacitor to provide a boost voltage at a first terminal of the boost capacitor that exceeds a target voltage. For example, the boost capacitor 104 is charged by coupling terminal 106 to a target voltage (VBAT) through activating the refresh device 122 based on the REFRESH signal.

At 1404, the method also includes supplying the boost voltage from the first terminal of the boost capacitor to a charge node for turning on a charge transistor based on a boost signal during a given charge cycle. For example, boost switch 112 is closed during the given charge cycle in response to the BOOST signal such that the boost voltage at 106 is supplied to the CHG node 114. As disclosed herein, a gate of the charge transistor 110 is coupled to the charge node 114 and a source of transistor is coupled to a battery (e.g., one or more cells) such that, when turned on, the transistor is configured to charge the battery to the desired battery voltage VBAT, as disclosed herein.

At 1406, the method also includes controlling discharge of the charge node to a clamp voltage that is sufficient to turn off the charge transistor to complete the given charge cycle and facilitate charging of the charge node in a next charge cycle. For example, pull down circuit 128, 600 or 700 is activated based on an EN_PD signal to discharge the voltage at terminal 114 according to the pull-down mode being implemented. As disclosed herein, the pull down mode may be implement a hard or soft pull down mode. As a further example, the control of discharging at 1406 may include controlling the discharge of the charge node to a level below the clamp voltage in response to a first pull-down enable signal indicating to implement a hard pull-down mode. Additionally or alternatively, the discharge control may include controlling the discharge of the charge node to the clamp voltage in response to a second pull-down enable signal indicating to implement a soft pull-down mode. As disclosed herein, the first and second pull-down enable signals may be inverted versions of each other.

In some examples, the method 1400 may also include pre-charging the boost capacitor to the target voltage based a refresh signal that is provided preceding or during the given charge cycle. Additionally, a regulated voltage is provided (by regulator 130) to a second terminal of the boost capacitor based on a regulate signal. In this example, the regulated voltage is added to the target voltage to provide an aggregate boost voltage at the first terminal of the boost capacitor in which the boost voltage exceeds the target voltage by the regulated voltage (e.g., boost voltage at 106 approximates VREG+VBAT).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method comprising:
   charging a boost capacitor to provide a boost voltage at a first terminal of the boost capacitor that exceeds a target voltage;
   supplying the boost voltage from the first terminal of the boost capacitor to a charge node for turning on a charge transistor based on a boost signal, the charge transistor being coupled to the charge node; and
   controlling discharge of the charge node to a clamp voltage that is sufficient to turn off the charge transistor and facilitate charging of the charge node.

2. The method of claim 1, wherein charging the boost capacitor further comprises:
   pre-charging the boost capacitor to the target voltage based on a refresh signal preceding or during a charge cycle; and
   providing a regulated voltage to a second terminal of the boost capacitor based on a regulate signal, the regulated voltage being added to the target voltage to provide the boost voltage at the first terminal of the boost capacitor in which the boost voltage exceeds the target voltage by the regulated voltage.

3. The method of claim 2, wherein controlling discharge further comprises at least one of:
   controlling the discharge of the charge node to a level below the clamp voltage in response to a first pull-down enable signal indicating to implement a hard pull-down mode; and
   controlling the discharge of the charge node to the clamp voltage in response to a second pull-down enable signal indicating to implement a soft pull-down mode, the first and second pull-down enable signals being inverted versions of each other.

4. A system comprising:
   a boost circuit comprising a boost capacitor, the boost circuit configured to provide a boost voltage at a first terminal of the boost capacitor by increasing the boost voltage at the first terminal to exceed a target voltage for a given charge cycle;
   a boost switch configured to supply the boost voltage from the first terminal to a charge node for turning on a transistor, which is coupled to the charge node, based on a boost signal during the given charge cycle; and a pull-down circuit configured to control discharge of the charge node to a clamp voltage that is sufficient to turn off the transistor for the given charge cycle and to facilitate charging of the charge node in a next charge cycle.

5. The system of claim 4, wherein the boost circuit comprises a voltage regulator configured to provide a regulated voltage to the boost capacitor based on a regulate signal, the regulated voltage being added to the target voltage to provide the boost voltage at the first terminal of the boost capacitor, the boost voltage exceeding the target voltage by the regulated voltage.

6. The system of claim 5, wherein the boost circuit further comprises a refresh switch configured to pre-charge the boost capacitor to the target voltage in response to a refresh signal prior to or during the given charge cycle.

7. The system of claim 6, further comprising a timing control circuit configured to control sequencing and duration of each of the regulate signal, the refresh signal and the boost signal for each charge cycle.

8. The system of claim 7, wherein the duration of each of the regulate signal, the refresh signal and the boost signal is programmable.

9. The system of claim 4, further comprising pull-down mode control logic configured to operate the pull-down circuit in at least one of a soft pull-down mode in which the charge node is discharged to the clamp voltage or a hard pull-down mode in which the charge node is discharged to a level that is less than the clamp voltage.

10. The system of claim 9, wherein the pull-down circuit comprises:

a discharge transistor in series with a discharge resistor between the charge node and an electrical ground terminal, the discharge transistor configured to discharge the charge node to the level below the clamp voltage in response to the pull-down mode control logic providing a first pull-down enable signal to implement the hard pull-down mode; and a clamp circuit coupled to the discharge transistor and configured to control the discharge of the charge node to the clamp voltage in response to the pull-down mode control logic providing a second pull-down enable signal to implement the soft pull-down mode, the first and second pull-down enable signals being inverted versions of each other.

11. The system of claim 4, further comprising a charge pump circuit configured to apply a charge pump voltage to the charge node to turn on the transistor for each charge cycle.

12. The system of claim 11, wherein the target voltage is a battery voltage and the clamp voltage approximates the battery voltage, and the transistor comprises a field effect transistor having a gate coupled to the charge node and a source coupled to the battery voltage.

13. A circuit comprising:

a charge pump having an output coupled to a charge terminal, the charge terminal is adapted to be coupled to a control input of a charge transistor;

a pull-down circuit coupled between the charge terminal and a first voltage terminal having a voltage lower than a voltage of the charge terminal;

a refresh device having an input coupled to a second voltage terminal and having an output coupled to a first boost terminal;

a third voltage terminal having an output coupled to a second boost terminal;

a boost capacitor coupled between the first and second boost terminals; and a boost switch coupled between the output of the charge pump and a node between the output of the refresh device and the first boost terminal.

14. The circuit of claim 13, wherein the charge transistor comprises a field effect transistor (FET) having a gate coupled to the charge terminal and a source coupled to the second voltage terminal.

15. The circuit of claim 14, wherein the FET comprises a first FET, wherein the pull-down circuit comprises:

a second FET having a gate to receive to a first pull-down enable signal, a drain coupled to the charge terminal and a source coupled to the first voltage terminal, the second FET being activated in response to the first pull-down enable signal to discharge the charge terminal during a hard pull-down mode; and a clamp circuit coupled to the second FET, the clamp circuit being configured to control the discharge of the charge terminal to a clamp voltage in response to a second pull-down enable signal being asserted during a soft pull-down mode, the first and second pull-down enable signals being logic signals that are inverted versions of each other.

16. The circuit of claim 13, wherein the boost switch is configured to supply a boost voltage from the first boost terminal of the boost capacitor to the charge terminal for turning on the charge transistor, which is coupled to the charge terminal, based on a boost signal during a given charge cycle, the pull-down circuit is configured to control discharge of the charge terminal to a clamp voltage that is sufficient to turn off the charge transistor for the given charge cycle and to facilitate charging of the charge terminal in a next charge cycle, the circuit further comprising a voltage regulator having an output corresponding to the third voltage terminal, the voltage regulator is configured to provide a regulated voltage to the second boost terminal of the boost capacitor based on a regulate signal during the given charge cycle, the regulated voltage being added to a target voltage across the boost capacitor to provide the boost voltage at a first terminal of the boost capacitor during the given charge cycle.

17. The circuit of claim 16, wherein the refresh device is configured to pre-charge the boost capacitor to the target voltage in response to a refresh signal preceding or during the given charge cycle.

18. The circuit of claim 17, further comprising a timing control circuit configured to control sequencing and duration of each of the regulate signal, the refresh signal and the boost signal for each charge cycle.

19. The circuit of claim 18, wherein the duration of each of the regulate signal, the refresh signal and the boost signal is programmable.

20. The circuit of claim 17, further comprising pull-down mode control logic configured to control the pull-down circuit in one of a soft pull-down mode in which the charge terminal is discharged to the clamp voltage or a hard pull-down mode in which the charge terminal is discharged to a level that is less than the clamp voltage.

21. The circuit of claim 20, wherein the pull-down circuit comprises:

a discharge transistor between the charge terminal and the second voltage terminal, the discharge transistor configured to discharge the charge terminal to the level below the clamp voltage in response to the pull-down mode control logic providing a first pull-down enable signal to implement the hard pull-down mode; and a clamp circuit coupled to the discharge transistor and configured to control the discharge of the charge terminal to the clamp voltage in response to the pull-down mode control logic providing a second pull-down enable signal to implement the soft pull-down mode, the first and second pull-down enable signals being inverted versions of each other.

\* \* \* \* \*